United States Patent
Fujita et al.

(10) Patent No.: US 10,193,016 B2
(45) Date of Patent: Jan. 29, 2019

(54) III-NITRIDE SEMICONDUCTOR LIGHT EMITTING DEVICE AND METHOD OF PRODUCING THE SAME

(71) Applicant: DOWA Electronics Materials Co., Ltd., Chiyoda-ku, Tokyo (JP)

(72) Inventors: Takehiko Fujita, Gotenba (JP); Yasuhiro Watanabe, Akita (JP)

(73) Assignee: DOWA Electronics Materials Co., Ltd., Chiyoda-ku, Tokyo (JP)

( * ) Notice: Subject to any disclaimer, the term of this patent is extended or adjusted under 35 U.S.C. 154(b) by 0 days.

(21) Appl. No.: 15/547,866

(22) PCT Filed: Feb. 3, 2016

(86) PCT No.: PCT/JP2016/000566
§ 371 (c)(1),
(2) Date: Aug. 1, 2017

(87) PCT Pub. No.: WO2016/125492
PCT Pub. Date: Aug. 11, 2016

(65) Prior Publication Data
US 2018/0019375 A1  Jan. 18, 2018

(30) Foreign Application Priority Data

Feb. 5, 2015  (JP) ................ 2015-021118
Feb. 2, 2016  (JP) ................ 2016-018199

(51) Int. Cl.
*H01L 33/00*  (2010.01)
*H01L 33/14*  (2010.01)
(Continued)

(52) U.S. Cl.
CPC .......... *H01L 33/145* (2013.01); *H01L 33/007* (2013.01); *H01L 33/06* (2013.01); *H01L 33/32* (2013.01); *H01L 33/325* (2013.01)

(58) Field of Classification Search
CPC ..... H01L 33/145; H01L 33/325; H01L 33/06; H01L 33/007
See application file for complete search history.

(56) References Cited

U.S. PATENT DOCUMENTS 6,515,308 B1 * 2/2003 Kneissl .............. H01S 5/18341
257/104
6,800,876 B2 * 10/2004 Edmond ................ B82Y 20/00
257/103
(Continued)

FOREIGN PATENT DOCUMENTS

CN  102792470 A  11/2012
CN  103430334 A  12/2013
(Continued)

OTHER PUBLICATIONS

Aug. 8, 2017, International Preliminary Report on Patentability issued in the International Patent Application No. PCT/JP2016/000566.

(Continued)

*Primary Examiner* — Nikolay Yushin
(74) *Attorney, Agent, or Firm* — Kenja IP Law PC

(57) ABSTRACT

Provided is a III-nitride semiconductor light-emitting device having excellent device lifetime as compared with conventional devices and a method of producing the same. A III-nitride semiconductor light-emitting device 100 has an n-type semiconductor layer 30, a light emitting layer 40 containing at least Al, an electron blocking layer 50, and a p-type semiconductor layer 60 in this order. The light emitting layer 40 has a quantum well structure having well layers 41 and barrier layers 42. The electron blocking layer 50 is adjacent to the light emitting layer 40 and is formed from a layer having an Al content higher than that of the barrier layers 42 and the p-type semiconductor layer 60. The electron blocking layer 50 has a Si-based doped region layer 50a.

19 Claims, 4 Drawing Sheets

(51) Int. Cl.
*H01L 33/32* (2010.01)
*H01L 33/06* (2010.01)

(56) References Cited

U.S. PATENT DOCUMENTS

| | | | | |
|---|---|---|---|---|
| 7,132,695 | B2* | 11/2006 | Ou | H01L 33/025 |
| | | | | 257/103 |
| 8,227,789 | B2* | 7/2012 | Hirayama | H01L 33/32 |
| | | | | 257/13 |
| 9,147,804 | B2* | 9/2015 | Kato | H01L 33/32 |
| 9,660,133 | B2* | 5/2017 | Jain | H01L 33/0025 |
| 2002/0093020 | A1* | 7/2002 | Edmond | B82Y 20/00 |
| | | | | 257/79 |
| 2004/0104399 | A1* | 6/2004 | Ou | H01L 33/025 |
| | | | | 257/102 |
| 2012/0235116 | A1* | 9/2012 | Su | H01L 33/06 |
| | | | | 257/13 |
| 2014/0014997 | A1* | 1/2014 | Kato | H01L 33/32 |
| | | | | 257/98 |
| 2015/0083994 | A1* | 3/2015 | Jain | H01L 33/0025 |
| | | | | 257/13 |

FOREIGN PATENT DOCUMENTS

| | | |
|---|---|---|
| JP | 2000151023 A | 5/2000 |
| JP | 2010161311 A | 7/2010 |
| JP | 2014241397 A | 12/2014 |
| WO | 2013046419 A1 | 4/2013 |
| WO | 2013128913 A1 | 9/2013 |

OTHER PUBLICATIONS

Mar. 15, 2016, Notification of Reasons for Refusal issued by the Japan Patent Office in the corresponding Japanese Patent Application No. 2016-018199.

Mar. 22, 2016, International Search Report issued in the International Patent Application No. PCT/JP2016/000566.

Aug. 23, 2018, Office Action issued by the Taiwan Intellectual Property Office in the corresponding Taiwanese Patent Application No. 105103911.

Sep. 5, 2018, Office Action issued by the State Intellectual Property Office in the corresponding Chinese Patent Application No. 201680008730.3.

* cited by examiner

III-NITRIDE SEMICONDUCTOR LIGHT EMITTING DEVICE AND METHOD OF PRODUCING THE SAME

TECHNICAL FIELD

This disclosure relates to a III-nitride semiconductor light-emitting device and a method of producing the same. This disclosure relates in particular to a III-nitride semiconductor light-emitting device having an excellent device lifetime and a method of producing the same.

BACKGROUND

III-nitride semiconductors formed from compounds in which N is combined with Al, Ga, In, or the like have conventionally been used as materials for ultraviolet light-emitting devices. III-nitride semiconductors made of high-Al-content AlGaN are particularly used for ultraviolet light-emitting devices or deep ultraviolet light light-emitting devices (DUV-LED) emitting light at a wavelength of 300 nm or less.

Examples of the characteristics required of a III-nitride semiconductor light-emitting device include high external quantum efficiency characteristics and low resistance characteristics. The applicant proposes in JP 2010-161311 A (PTL 1) that a layer serving as an energy barrier for electrons, which is called an electron blocking layer, is formed between a light emitting layer having a quantum well structure and a p-type cladding layer, thereby improving the light emission efficiency. The electron blocking layer serves as a barrier against a quantum well layer of a light emitting layer and prevents electrons from flowing excessively; thus, the efficiency of carrier injection can be improved.

Further, JP 2000-151023 A (PTL 2) discloses a semiconductor light-emitting device using a nitride-based compound semiconductor, in which a heavily doped layer having locally been doped at a concentration higher than that for the whole p-type cladding layer is provided in a p-type cladding layer on the p-side light guide layer boundary side. According to PTL 2, the provision of the heavily doped layer having locally been doped at a concentration higher than that for the whole p-type cladding layer in part of the p-type cladding layer leads to increased hole concentration without reducing the crystallinity of the p-type cladding layer, thereby reducing the series resistance to lower the threshold current density.

CITATION LIST

Patent Literature

PTL 1: JP 2010-161311 A
PTL 2: JP 2000-151023 A

SUMMARY

Technical Problem

The techniques disclosed in PTL 1 and PTL 2 can improve external quantum efficiency characteristics and resistance characteristics of a III-nitride semiconductor light-emitting device. However, other than improvement in the external quantum efficiency characteristics and resistance characteristics, there is a demand for improved device lifetime characteristics of a III-nitride semiconductor light-emitting device. Thus, there is room for improvement in terms of its lifetime.

In view of the above, it could be helpful to provide a III-nitride semiconductor light-emitting device having an excellent device lifetime as compared with conventional devices and a method of producing the III-nitride semiconductor light-emitting device.

Solution to Problem

The inventors intensively studied ways to address the above challenges and focused on dopants for an electron blocking layer disposed closer to a p-type semiconductor layer than to a light emitting layer in a III-nitride semiconductor light-emitting device. Mg is typically used as a p-type dopant for doping a part of a III-nitride semiconductor light-emitting device on the p-type semiconductor layer side. The inventors speculated that Mg introduced into the part on the p-type semiconductor layer side by doping diffused into the light emitting layer and might affected the life characteristics of the III-nitride semiconductor light-emitting device. Thereupon, the inventors found that the lifetime of a III-nitride semiconductor light-emitting device can be improved by providing a layer constituting a region doped with Si-containing impurities (hereinafter also referred to as a Si-based doped region layer) in an electron blocking layer between an active layer and a p-type semiconductor layer. This discovery led to the present invention.

Specifically, we propose the following features.

(1) A III-nitride semiconductor light-emitting device including an n-type semiconductor layer; a light emitting layer containing at least Al; an electron blocking layer; and a p-type semiconductor layer in this order. The light emitting layer has a quantum well structure constituted by a stack of well layers and barrier layers, the electron blocking layer is adjacent to the light emitting layer and is formed from a layer having an Al content higher than that of the barrier layers and the p-type semiconductor layer, and the electron blocking layer includes a Si-based doped region layer.

(2) The III-nitride semiconductor light-emitting device according to (1) above, wherein the electron blocking layer further includes a p-type doped region layer closer to the p-type semiconductor layer than to the Si-based doped region layer.

(3) The III-nitride semiconductor light-emitting device according to (1) or (2) above, wherein the electron blocking layer further includes an undoped region layer.

(4) The III-nitride semiconductor light-emitting device according to (3) above, wherein the undoped region layer is disposed between the Si-based doped region layer and the p-type doped region layer.

(5) The III-nitride semiconductor light-emitting device according to any one of (1) to (4) above, wherein the Si-based doped region layer is adjacent to the light emitting layer.

(6) The III-nitride semiconductor light-emitting device according to any one of (1) to (5) above, wherein the p-type semiconductor layer includes a p-type contact layer made of $Al_xGa_{1-x}N$, where s satisfies $0 \leq x \leq 0.1$.

(7) The III-nitride semiconductor light-emitting device according to (6) above, further comprising a p-type cladding layer having an Al content lower than that of the electron blocking layer and an Al content higher than that of the p-type contact layer, between the electron blocking layer and the p-type contact layer.

(8) The III-nitride semiconductor light-emitting device according to (7) above, wherein the p-type cladding layer is made of $Al_yGa_{1-y}N$, where y satisfies $0.2 \leq y$.

(9) The III-nitride semiconductor light-emitting device according to any one of (1) to (8) above, wherein an impurity concentration of Si in the Si-based doped region layer is $5 \times 10^{16}$ atoms/cm$^3$ to $1 \times 10^{18}$ atoms/cm$^3$.

(10) The III-nitride semiconductor light-emitting device, according to any one of (1) to (9) above, wherein the barrier layer is made of $Al_bGa_{1-b}N$, where b satisfies $0.4 \leq b \leq 0.95$, and the electron blocking layer is made of $Al_zGa_{1-z}N$, where z satisfies $b < z \leq 1$.

(11) The III-nitride semiconductor light-emitting device according to any one of (1) to (10) above, wherein a dopant for the Si-based doped region layer is Si alone.

(12) The III-nitride semiconductor light-emitting device according to any one of (1) to (10) above, wherein dopants for the Si-based doped region layer are Si and Mg.

(13) The III-nitride semiconductor light-emitting device according to any one of (1) to (12) above, wherein light emitted from the light emitting layer is deep ultraviolet light having a center wavelength of 300 nm or less.

(14) A method of producing a III-nitride semiconductor light-emitting device, comprising: an n-type semiconductor layer formation step of forming an n-type semiconductor layer; a light emitting layer formation step of forming, on the n-type semiconductor layer, a light emitting layer which contains at least Al and has a quantum well structure constituted by a stack of well layers and barrier layers; an electron blocking layer formation step of forming, on the light emitting layer, an electron blocking layer having an Al content higher than that of the barrier layers; and a p-type semiconductor layer formation step of forming a p-type semiconductor layer on the electron blocking layer. In the electron blocking layer formation step, a Si-based doped region layer is formed by doping with Si-containing impurities.

(15) A III-nitride semiconductor light-emitting device including an n-type semiconductor layer; a light emitting layer containing at least Al; an electron blocking layer; and a p-type semiconductor layer in this order. The light emitting layer has a quantum well structure constituted by a stack of well layers and barrier layers, the electron blocking layer is adjacent to the light emitting layer and is formed from a layer having an Al content higher than that of the barrier layers and the p-type semiconductor layer, the electron blocking layer includes a Si-based doped region layer, and the electron blocking layer further includes a p-type doped region layer closer to the light emitting layer than to the Si-based doped region layer.

(16) The III-nitride semiconductor light-emitting device according to (15) above, wherein the Si-based doped region layer is adjacent to the p-type semiconductor layer.

(17) The III-nitride semiconductor light-emitting device, according to (15) or (16) above, wherein the barrier layer is made of $Al_bGa_{1-b}N$, where b satisfies $0.4 \leq b \leq 0.95$, and the electron blocking layer is made of $Al_zGa_{1-z}N$, where z satisfies $b < z \leq 1$.

(18) The III-nitride semiconductor light-emitting device according to any one of (15) to (17) above, wherein a dopant for the Si-based doped region layer is Mg.

(19) The III-nitride semiconductor light-emitting device according to any one of (15) to (18) above, wherein dopants for the Si-based doped region layer are Si and Mg.

(20) The III-nitride semiconductor light-emitting device according to any one of (15) to (19) above, wherein light emitted from the light emitting layer is deep ultraviolet light having a center wavelength of 300 nm or less.

Advantageous Effect

Since a Si-based doped region layer is provided in an electron blocking layer in the disclosed III-nitride semiconductor light-emitting device, this disclosure can provide a III-nitride semiconductor light-emitting device having an excellent device lifetime as compared with conventional devices, and a method of producing the same.

BRIEF DESCRIPTION OF THE DRAWINGS

In the accompanying drawings.

DETAILED DESCRIPTION

Figure 1:
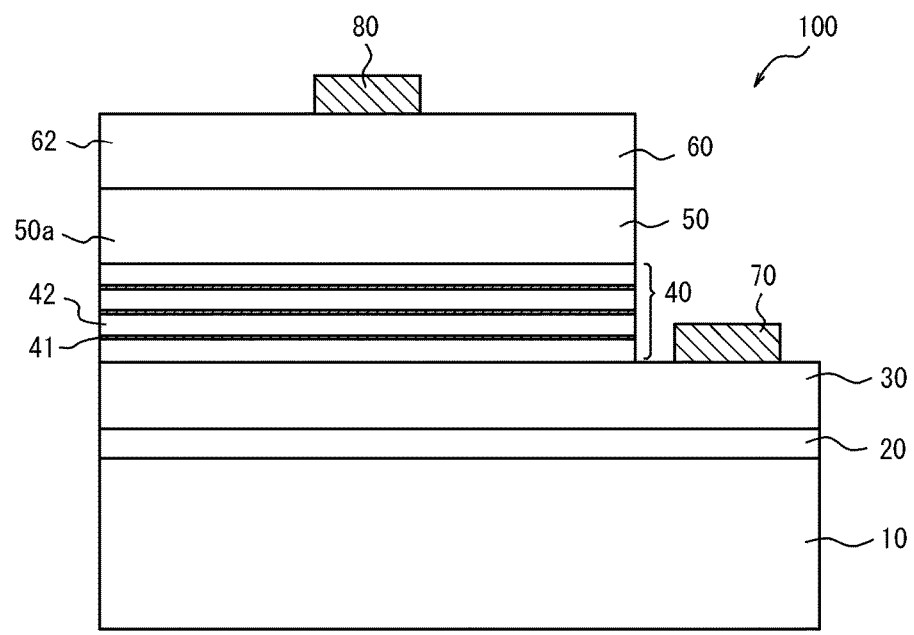
FIG. 1 is a schematic cross-sectional view illustrating a III-nitride semiconductor light-emitting device according to Embodiment 1.

Embodiments will now be described with reference to the drawings. In principle, like components are denoted by the same reference numerals, and the description of those components will not be repeated. A substrate and layers in each diagram are exaggerated for convenience of description, so that the aspect ratio does not conform to the actual ratio.

(Embodiment 1: III-nitride Semiconductor Light-emitting Device 100)

As illustrated in FIG. 1, a III-nitride semiconductor light-emitting device 100 according to one embodiment has an n-type semiconductor layer 30, a light emitting layer 40 containing at least Al, an electron blocking layer 50, and a p-type semiconductor layer 60 in this order. The light emitting layer 40 has a quantum well structure constituted by a stack of well layers 41 and barrier layers 42. The electron blocking layer 50 is adjacent to the light emitting layer 40 and is formed from a layer having an Al content higher than that of the barrier layers 42 and the p-type semiconductor layer 60. The electron blocking layer 50 has a Si-based doped region layer 50a.

As illustrated in FIG. 1, the n-type semiconductor layer 30 of the III-nitride semiconductor light-emitting device 100 can be provided on an AlN template substrate in which an AlN layer 20 is provided on a surface of a substrate 10. Further, the III-nitride semiconductor light-emitting device 100 may be provided with an n-type electrode 70 formed on the n-type semiconductor layer 30 exposed by removing part of the light emitting layer 40, the electron blocking layer 50, and the p-type semiconductor layer 60 by means of etching or the like, and with a p-type electrode 80 formed on a p-type contact layer 62. In the III-nitride semiconductor light-emitting device 100 according to one embodiment, the n-type semiconductor layer 30, the light emitting layer 40, the electron blocking layer 50, and the p-type semiconductor layer 60 are characteristic features. Of those, the electron blocking layer 50 is a particularly characteristic feature. The sapphire substrate 10, the AlN layer 20, the n-type electrode 70, and the p-type electrode 80 may have a typical structure and the structure is not specifically limited. Each semiconductor layer in the III-nitride semiconductor light-emitting device 100 is made of for example an AlGaN material, and may contain 5% or less of In as a Group III element with respect to Al and Ga. This also applies to a III-nitride semiconductor light-emitting device 200 to be described. The n-type semiconductor layer 30, the light emitting layer 40, the electron blocking layer 50, and the p-type semiconductor layer 60 that are characteristic features of this disclosure will now be described first.

The n-type semiconductor layer 30 is a III-nitride semiconductor layer containing at least Al, and any typical n-type semiconductor layer can be used. As described above, the n-type semiconductor layer 30 is made of for example an AlGaN material, and may contain 5% or less of In as a Group III element with respect to Al and Ga. The n-type semiconductor layer 30 is doped with an n-type dopant (impurities). Examples of the n-type dopant include Si, Ge, Sn, S, O, Ti, and Zr. The dopant concentration is not limited as long as the n-type semiconductor layer 30 can serve as an n-type layer; for example, the dopant concentration can be $1.0\times10^{18}$ atoms/cm$^3$ to $1.0\times10^{20}$ atoms/cm$^3$. Further, the Al content of the n-type semiconductor layer 30 is not limited in particular and may be within a typical range. The n-type semiconductor layer 30 may be constituted by a single layer or a plurality of layers.

The light emitting layer 40 is provided on the n-type semiconductor layer 30. The light emitting layer 40 contains at least Al, and can be formed from, for example, an $Al_aGa_{1-a}N$ material ($0<a\leq1$). Here, the Al content is suitably set so that light having the desired wavelength is emitted. When the Al content a is 0.35 or more (i.e., $0.35\leq a\leq1$), the center wavelength of the light emitted from the light emitting layer 40 is 300 nm or less. In this case, the III-nitride semiconductor light-emitting device 100 to be ultimately obtained is a DUV-LED.

This light emitting layer 40 can have a multiple quantum well (MQW) structure in which the well layers 41 and the barrier layers 42 made of AlGaN having different Al contents are repeatedly formed. The Al content of the well layers 41 is, for example, 0.3 to 0.8. The Al content b of the barrier layers 42 is higher than the Al content of the well layers 41, and is for example, 0.40 to 0.95. Further, the number of repetitions of the well layers 41 and barrier layers 42 is, for example, 1 to 10. The layers in the light emitting layer 40 closest to the n-type semiconductor layer 30 and the electron blocking layer 50 (i.e., the top and bottom layers) are preferably barrier layers. Accordingly, when the number of repetitions of the well layers 41 and the barrier layers 42 is n, those layers are referred to as "n.5 pairs of well layers and barrier layers". The thickness of the well layers 41 may be 0.5 nm to 5 nm, whereas the thickness of the barrier layers 42 may be 3 nm to 30 nm.

The electron blocking layer 50 is provided adjacent to the light emitting layer 40, and is formed from a layer having an Al content b higher than that of the barrier layers 42 and the p-type semiconductor layer 60. The electron blocking layer 50 is typically provided between the light emitting layer and the p-type cladding layer to stop electrons so as to be used as a layer that allows the electrons to be injected into the light emitting layer 40 (the well layers 41 in the case of the MQW) thereby improving the electron injection efficiency. In particular, when the Al content of the light emitting layer 40 is high, the hole concentration of the p-type semiconductor layer 60 is low, which makes it difficult to inject holes into the light emitting layer 40, in which case, the electrons would partly flow to the p-type semiconductor layer 60 side. The provision of the electron blocking layer 50 allows such a flow of electrons to be avoided. Note that the "electron blocking layer" herein means a layer having an Al content z that is higher than the Al content b of the barrier layers 42 constituting part of the light emitting layer 40, and having a large band gap. On the other hand, the Al content of the "cladding layer" herein refers to an Al content more than 0.1 lower than that of the electron blocking layer and more than 0.1 higher than that of the p-type contact layer. As will be described, the p-type semiconductor layer 60 may or may not have a p-type cladding layer 61. In one embodiment, when a p-type cladding layer 61 is provided in the III-nitride semiconductor light-emitting device 100, the Al content y of the p-type cladding layer 61 is expressed as $x+0.1<y<z-0.1$ using the Al content z of the electron blocking layer 50 and the Al content x of the p-type contact layer 62. Note that when p-type AlGaN used for a center wavelength of 300 nm or less has a higher Al content, the current more hardly flows. Accordingly, a conventional cladding layer often has an Al content equal to or lower than that of conventional barrier layers. Therefore, the disclosed electron blocking layer and a conventional cladding layer are distinguished based on the Al content of barrier layers.

The electron blocking layer 50 can be formed of, for example, an $Al_zGa_{1-z}N$ material ($b<z\leq1$). Although depending on the Al content of the barrier layers 42, the Al content of the electron blocking layer 50 is preferably, for example, 0.5 or more and 1.0 or less (i.e., $b<z\leq1$ and $0.5\leq z$). Such an electron blocking layer 50 can increase the efficiency in the injection of electrons into the well layers 41. Further, the thickness of the whole electron blocking layer 50 is preferably, for example, 6 nm to 60 nm. If the thickness of the electron blocking layer 50 is either smaller than 6 nm or larger than 60 nm, the output is significantly reduced. Note that the thickness of the electron blocking layer 50 is preferably larger than the thickness of the barrier layers 42. The technical significance of providing the Si-based doped region layer 50a in the electron blocking layer will be described below. Note that the electron blocking layer may be partly or wholly doped with a p-type dopant in addition to Si, in which case, examples of the p-type dopant include Mg, Zn, Ca, Be, and Mn. The average dopant concentration of the overall p-type semiconductor layer 60 is not limited in particular as long as the layer can serve as a p-type layer (having p-type conductivity), and can be for example $1.0\times10^{18}$ atoms/cm$^3$ to $5.0\times10^{21}$ atoms/cm$^3$.

In this embodiment, the p-type semiconductor layer 60 has at least the p-type contact layer 62. The p-type contact layer 62 may be made of a p-type $Al_xGa_{1-x}N$ material having an Al content x satisfying $0\leq x\leq0.1$. The p-type contact layer 62 is a layer for reducing the contact resistance between the p-type electrode 80 to be formed thereon and the electron blocking layer 50, which sufficiently reduces the contact resistance to the p-type electrode 80 formed on the p-type contact layer 62. In particular, x=0 (i.e., GaN) is preferably satisfied. A dopant used to impart p-type conductivity to the p-type contact layer 62 may be magnesium (Mg) or zinc (Zn). The thickness of the p-type contact layer 62 may be 5 nm or more and 200 nm or less. Although not shown, the p-type contact layer 62 may have a multi-layer structure in which any one or more of the Al content, dopant species, dopant concentration, carrier gas used in the formation, and the like are varied.

Here, it is important to provide the Si-based doped region layer 50a in the electron blocking layer 50. Note that the whole electron blocking layer 50 may constitute the Si-based doped region layer 50a (FIG. 1). As will be described in Examples, the results of the experiments performed by the inventors demonstrated that the provision of a Si-based doped region layer 50a improved the device lifetime of the III-nitride semiconductor light-emitting device 100.

Although theoretical reasons for the improvement in the device lifetime have not been revealed, the inventors believe that the reasons are as follows. That is, Mg introduced into the p-type semiconductor layer by doping easily diffuses into the light emitting layer to cause defects due to Mg in the light emitting layer. This seems to result in reduced device lifetime. On the other hand, Si usually used as an n-type dopant hardly diffuses into the light emitting layer, and conceivably inhibits the diffusion of Mg. Accordingly, the inventors speculate that doping the electron blocking layer between the light emitting layer and the p-type semiconductor layer with Si would stop moving of defects due to Mg. Although Mg is used as a typical p-type dopant in the above description, the same phenomenon occurs even when other p-type impurities are used to form the p-type semiconductor layer 60 if the Si-based doped region layer 50a is provided. Thus, the provision of the Si-based doped region layer 50a in the electron blocking layer 50 is presumed to improve the device lifetime.

In this embodiment, a dopant for the Si-based doped region layer 50a may constitute impurities containing Si. The impurities may be constituted by Si alone or may be constituted by Si and Mg. When the dopant for the Si-based doped region layer 50a is Si alone, the Si impurity concentration may be $5 \times 10^{16}$ atoms/cm$^3$ to $1 \times 10^{18}$ atoms/cm$^3$, and is preferably $5 \times 10^{16}$ atoms/cm$^3$ to $1 \times 10^{17}$ atoms/cm$^3$, more preferably $5 \times 10^{16}$ atoms/cm$^3$ to $6 \times 10^{16}$ atoms/cm$^3$.

Doping with Mg increases hole injection efficiency and maintains light output power while reducing forward voltage; meanwhile, doping with Si can inhibit the diffusion of Mg into the light emitting layer and prevent the lifetime from being shortened. Therefore, it is also preferred that dopants for the Si-based doped region layer are Si and Mg. In this case, the preferred range of the Si impurity concentration is the same as that in the case of doping with Si alone, and the Mg impurity concentration may be $1 \times 10^{18}$ atoms/cm$^3$ to $1 \times 10^{20}$ atoms/cm$^3$. Further, the total of both impurity concentrations may be $2 \times 10^{18}$ atoms/cm$^3$ to $1 \times 10^{20}$ atoms/cm$^3$.

As described above, for the III-nitride semiconductor light-emitting device 100 according to this embodiment, the Si-based doped region layer 50a is provided in the electron blocking layer 50, thereby obtaining a III-nitride semiconductor light-emitting device having an excellent device lifetime as compared with conventional devices.

Figure 2A:
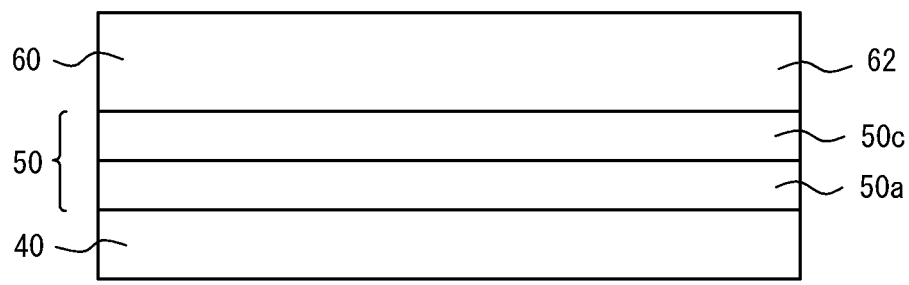
FIGS. 2A to 2D are schematic cross-sectional views each illustrating a light emitting layer, an electron blocking layer, and a p-type semiconductor layer in a III-nitride semiconductor light-emitting device according to a preferred embodiment of the disclosed embodiments.

Here, it is preferable in this embodiment that the electron blocking layer 50 further includes a p-type doped region layer 50c closer to the p-type semiconductor layer 60 than to the Si-based doped region layer 50a as illustrated in FIG. 2A. Note that the p-type doped region layer 50c is disposed between the Si-based doped region layer 50a and the p-type semiconductor layer 60. The provision of the p-type doped region layer 50c doped with p-type impurities increases the hole injection efficiency, so that the forward voltage can be reduced. A dopant for the p-type doped region layer 50c may preferably be but not limited to Mg. Further, when the p-type doped region layer 50c is provided, its thickness may be more than 0 nm and 60 nm or less, and is preferably 10 nm or more and 60 nm or less, more preferably 20 nm or more and 60 nm or less.

Figure 2B:
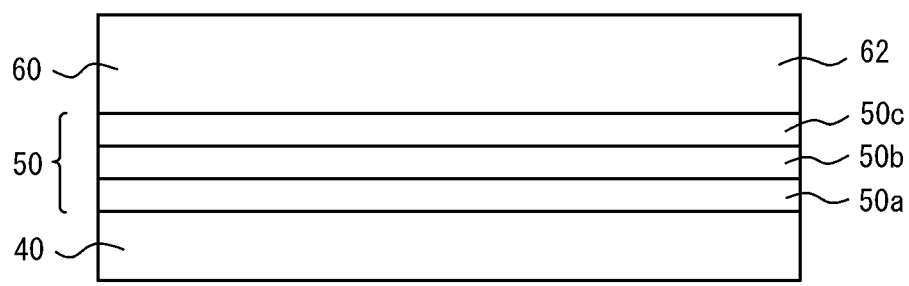

Preferably, the electron blocking layer 50 further includes an undoped region layer 50b. More preferably, as illustrated in FIG. 2B, the undoped region layer 50b is disposed between the Si-based doped region layer 50a and the p-type doped region layer 50c. When a thin Si doped layer is provided, since the diffusion length of the p-type impurities into the light emitting layer is shorter, the lifetime improvement is smaller, yet reduction in the light output power can be suppressed. When the undoped region layer 50b is interposed between the Si-based doped region layer 50a and the p-type doped region layer 50c, a suitable thickness of the Si doped layer can be achieved and the p-type impurities can be kept at a distance from the light emitting layer. Thus, reduction in the light output power and increased in the forward voltage due to doping of the electron blocking layer with Si can be suppressed and the device lifetime can be improved.

Figure 2C:
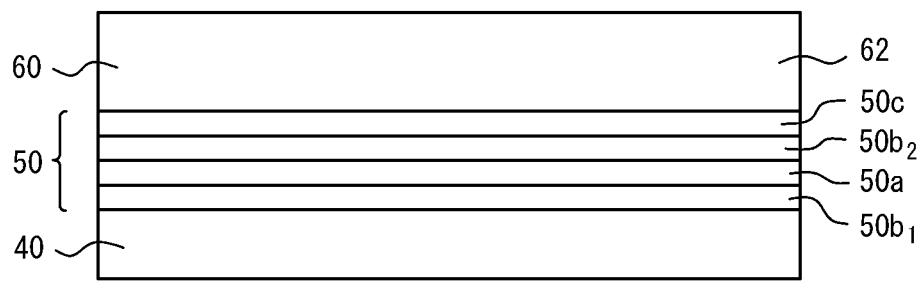

Further, a plurality of undoped region layers may be provided in the electron blocking layer 50. For example, as illustrated in FIG. 2C, the electron blocking layer 50 may include a first undoped layer 50b$_1$, the Si-based doped region layer 50a, a second undoped layer 50b$_2$, and the p-type doped region layer 50c in this order. On the other hand, it is also preferable that, as illustrated in FIGS. 2A and 2B, the Si-based doped region layer is adjacent to the light emitting layer 40. This positional relationship further ensures the above effect in inhibiting the diffusion of the p-type impurities.

The undoped region layer being "undoped" means that certain impurities such as Mg or Si are not deliberately added to the layer and inevitable impurities may be included. The undoped region layer according to this disclosure does not have either p-type or n-type electrical properties and has a low carrier density (for example less than $4 \times 10^{16}$/cm$^3$). The thickness of the undoped region layer 50b can be 1 nm to 60 nm, and is preferably 5 nm to 50 nm. When the electron blocking layer 50 has a Si-based doped region layer, an undoped region layer, and a p-type doped region layer, provided that the thickness of the whole electron blocking layer 50 is 60 nm or less, it is particularly preferred that the thickness of the Si-based doped region layer 50a is 1 nm to 20 nm (preferably 5 nm to 10 nm), the thickness of the p-type doped region layer 50c is 1 nm to 20 nm (preferably 5 nm to 10 nm), and the rest is allocated to the undoped region layer 50b.

Figure 2D:
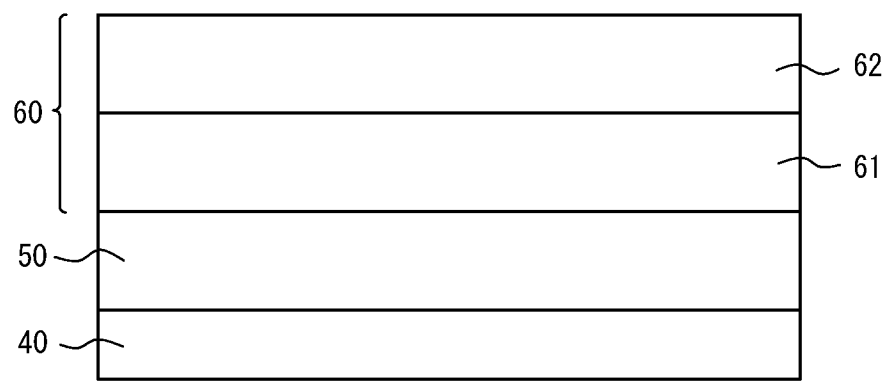

In the III-nitride semiconductor light-emitting device 100 according to this embodiment, the p-type cladding layer is optional and not necessarily provided. In other words, the p-type semiconductor layer 60 may be constituted by the p-type contact layer 62 alone as illustrated in FIGS. 2A and 2B. Alternatively, the p-type semiconductor layer 60 may further have the p-type cladding layer 61 between the electron blocking layer 50 and the p-type contact layer 62 as illustrated in FIG. 2D, with the Al content of the cladding layer 61 being lower than that of the electron blocking layer 50 and lower than that of the barrier layers 42. In this case, the hole injection efficiency can be improved by diving the band gap between the electron blocking layer 50 and the p-type contact layer 62. Thus, the provision of the p-type cladding layer 61 makes it possible to improve light output power and forward voltage of the III-nitride semiconductor light-emitting device 100. When the p-type cladding layer 52 is provided, its thickness may be 2 nm to 300 nm. On this occasion, the p-type cladding layer 61 may be made of $Al_yGa_{1-y}N$ (0.20≤y<b), and the Al content y of the p-type cladding layer 61 may satisfy 0.35≤y<b. Although not shown, the p-type cladding layer 61 may have a multi-layer structure in which the layers have different Al contents. In this case, when a p-type cladding layer on the light emitting layer side is a first p-type cladding layer and a p-type cladding layer on the p-type contact layer side is a second p-type cladding layer, the Al content of the first p-type cladding layer is preferably higher than that of the second p-type cladding layer.

The substrate 10, AlN layer 20, n-type electrode 70, and p-type electrode 80 depicted in FIG. 1 will be described below to describe specific aspects of those components by way of example, yet various modifications are possible. As stated above, in the disclosed embodiments, the sapphire substrate 10, AlN layer 20, n-type electrode 70, and p-type electrode 80 depicted in FIG. 1 do not limit this disclosure.

A sapphire substrate can be used as the substrate 10 of the III-nitride semiconductor light-emitting device 100. An AlN template substrate in which the AlN layer 20 is epitaxially grown on a surface of the sapphire substrate may be used. A given sapphire substrate can be used as the sapphire substrate, and the substrate may optionally have an off-angle. When an off-angle is provided, the crystallographic orientation in the inclination direction may be either in the m axis direction or in the a axis direction. For example, a main surface of the sapphire substrate may be the C plane inclined at an off-angle of 0.5°. When the AlN template substrate is used; preferably, the crystallinity of the AlN layer on the surface of the sapphire substrate is excellent. Further, a surface of the AlN template substrate is preferably provided with an undoped AlGaN layer.

The n-type electrode 70 can be formed, for example, as a metal composite film having a Ti-containing film and an Al-containing film formed on the Ti-containing film. The thickness, shape, and size of each of these films of the n-type electrode can be selected as appropriate in accordance with the shape and the size of the light-emitting device. Further, the p-type electrode 80 can be formed, for example, as a metal composite film having a Ni-containing film and an Au-containing film formed on the Ni-containing film. The thickness, shape, and size of these films in the p-type electrode can be appropriately selected in accordance with the shape and size of the light-emitting device.

(Embodiment 2: III-nitride Semiconductor Light-emitting Device 200)

Embodiment 1 above allows the III-nitride semiconductor light-emitting device 100 to have an improved device lifetime. The inventors found that although improvement in the device lifetime was achieved with respect to the III-nitride semiconductor light-emitting device 100, the light output power sometimes slightly decreased as compared with the case where the Si-based doped region layer 50a was not provided. In attempts to achieve improvements in both the device lifetime and output with the Si-based doped region layer 50a being provided, the inventors made further studies and completed the III-nitride semiconductor light-emitting device 200 according to Embodiment 2 to be described in detail below.

Figure 3:
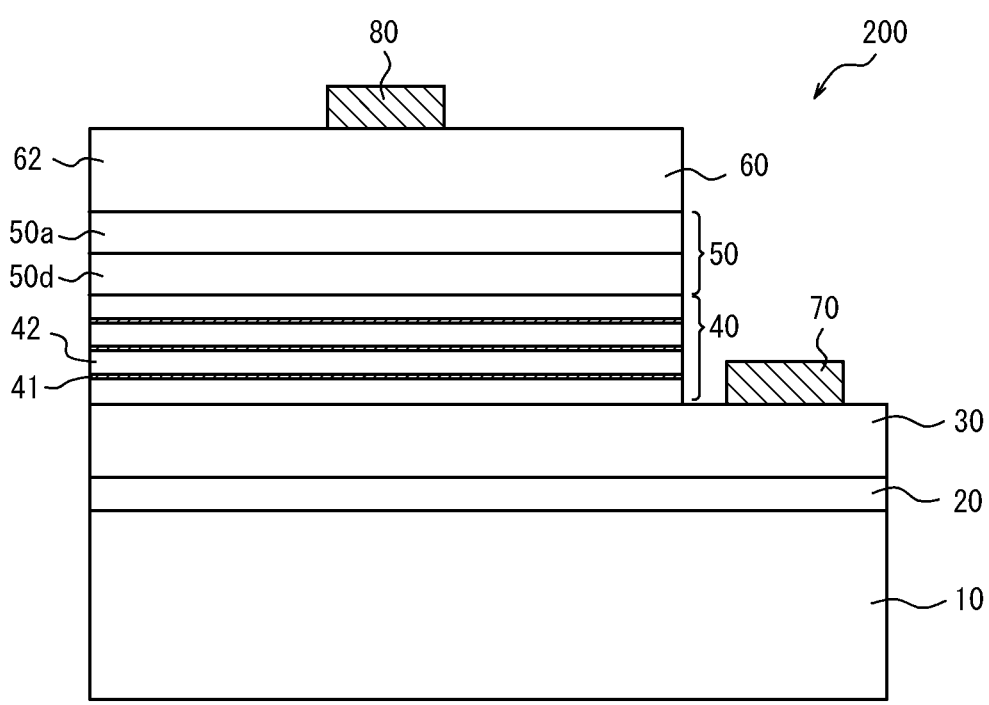
FIG. 3 is a schematic cross-sectional view illustrating a III-nitride semiconductor light-emitting device according to Embodiment 2.

That is, the III-nitride semiconductor light-emitting device 200 according to Embodiment 2 has the n-type semiconductor layer 30, the light emitting layer 40 containing at least Al, the electron blocking layer 50, and the p-type semiconductor layer 60 in this order as depicted in FIG. 3. The light emitting layer 40 has a quantum well structure constituted by a stack of well layers 41 and barrier layers 42. The electron blocking layer 50 is adjacent to the light emitting layer 40 and is formed from a layer having an Al content higher than that of the barrier layers 42 and the p-type semiconductor layer 60. The electron blocking layer 50 has a Si-based doped region layer 50a. The electron blocking layer 50 further includes a p-type doped region layer 50d closer to the light emitting layer 40 than to the Si-based doped region layer 50a. Features of Embodiment 2 that are similar to those in Embodiment 1 are denoted by the same reference numerals, and the description of the features will not be repeated.

Embodiment 2 is different from Embodiment 1 in that the electron blocking layer 50 further includes the p-type doped region layer 50d closer to the light emitting layer 40 than to the Si-based doped region layer 50a. The studies made by the inventors experimentally demonstrated that the provision of the p-type doped region layer 50d in this position made it possible to improve both device lifetime and output. The inventors consider the reason such an effect can be achieved is as follows based on the results of Experimental Example 2 to be described. That is, when the Si-based doped region layer 50a is on the light emitting layer 40 side, holes recombine before Si is injected into the light emitting layer 40, inhibiting the Si injection, which would cause reduction in the output. Here, the p-type impurity concentration (Mg in Experimental Example 2) is higher in the p-type contact layer 62 than in the electron blocking layer 50; the Mg diffusion has a large effect on the p-type contact layer 62. Accordingly, even when the Si-based doped region layer 50a of the electron blocking layer 50 is provided closer to the p-type contact layer 62, the diffusion of Mg (i.e., p-type impurities) can be sufficiently inhibited, resulting in improved device lifetime.

In this embodiment, the electron blocking layer 50 can be constituted by the p-type doped region layer 50d and the Si-based doped region layer 50a alone. The electron blocking layer 50 may further include the undoped region layer 50b or the p-type doped region layer 50c on the p-type semiconductor layer 60 side as in Embodiment 1. Note that in terms of the light output power, since the disposition of the undoped region layer 50b would be a factor in reducing the output, the undoped region layer 50b is preferably not provided.

Further, in this embodiment, the thickness of the p-type doped region layer 50d is not limited in particular, yet is preferably 10 nm or more and 100 nm or less, more preferably 15 nm or more and 80 nm or less. The thickness of the Si-based doped region layer 50a is also not limited in particular, yet is preferably 1 nm or more and 40 nm or less, more preferably 1 nm or more and 30 nm or less. On this occasion, the thickness of the p-type doped region layer 50d can be larger than the thickness of the Si-based doped region layer 50a. Further, the total thickness of the p-type doped region layer 50d and the Si-based doped region layer can be, for example, but not limited to 12 nm or more and 100 nm or less.

A dopant for the p-type doped region layer 50d is preferably Mg. In this case, the Mg impurity concentration may be $1 \times 10^{18}$ atoms/cm$^3$ to $1 \times 10^{20}$ atoms/cm$^3$. Further, the total of both impurity concentrations may be $2 \times 10^{18}$ atoms/cm$^3$ to $1 \times 10^{20}$ atoms/cm$^3$. Note that, as described in Embodiment 1, a p-type dopant other than Mg may be used as a dopant for the p-type doped region layer 50d.

Dopants for the Si-based doped region layer 50a are preferably Si and Mg. In this case, the Si impurity concentration may be $5 \times 10^{16}$ atoms/cm$^3$ to $5 \times 10^{19}$ atoms/cm$^3$, and is preferably $1 \times 10^{18}$ atoms/cm$^3$ to $2 \times 10^{19}$ atoms/cm$^3$ or less. When the Si impurity concentration is excessively high, the output would decrease. In this embodiment, a portion doped with Si is kept apart from the light emitting layer, so that a higher Si concentration is achieved compared with Embodiment 1. The portion doped with Si is kept apart from the light emitting layer and a higher concentration of Si and Mg are introduced in a mixed manner, thereby increasing the effect of Si in inhibiting the diffusion of Mg. Thus, desired improvements in both device lifetime and output can be achieved, which is preferable.

When dopants for the Si-based doped region layer 50*a* are Si and Mg, the Mg impurity concentration may be $1\times10^{18}$ atoms/cm$^3$ to $1\times10^{20}$ atoms/cm$^3$, and is preferably $5\times10^{18}$ atoms/cm$^3$ to $5\times10^{19}$ atoms/cm$^3$. Further, the total of the impurity concentrations of Si and Mg may be $2\times10^{18}$ atoms/cm$^3$ to $2\times10^{20}$ atoms/cm$^3$, and is preferably $5\times10^{18}$ atoms/cm$^3$ to $5\times10^{19}$ atoms/cm$^3$. Note that as described in Embodiment 1 above, a dopant for the Si-based doped region layer 50*a* may be Si alone. Also in the case of using only Si as the dopant, the Si impurity concentration may be $5\times10^{16}$ atoms/cm$^3$ to $5\times10^{19}$ atoms/cm$^3$, and is preferably $2\times10^{19}$ atoms/cm$^3$ or less.

As with Embodiment 1, the barrier layers are made of $Al_bGa_{1-b}N$ (0.4≤b≤0.95), and the electron blocking layer is $Al_zGa_{1-z}N$ (b<z≤1). Further, light emitted from the light emitting layer may be deep ultraviolet light having a center wavelength of 300 nm or less as in Embodiment 1.

As with Embodiment 1, the p-type cladding layer is optional and not necessarily provided in this embodiment. In other words, the p-type semiconductor layer 60 may be constituted by the p-type contact layer alone.

(Embodiment 3: Method of Producing III-nitride Semiconductor Light-emitting Device)

Figure 4:
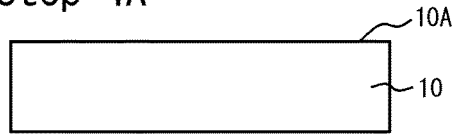
FIG. 4 is a view illustrating steps in a method of producing a III-nitride semiconductor light-emitting device according to a preferred embodiment.
Figure 4:
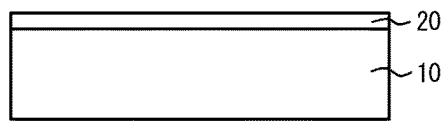
Figure 4:
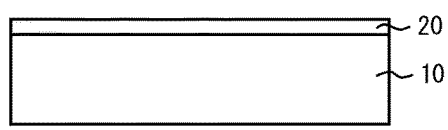
Figure 4:
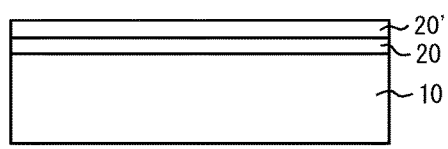
Figure 4:
Figure 4:
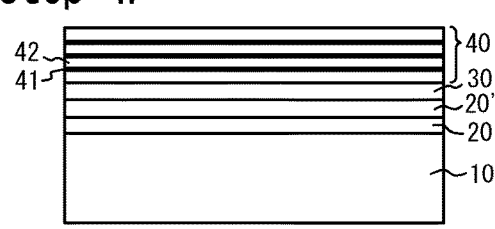
Figure 4:
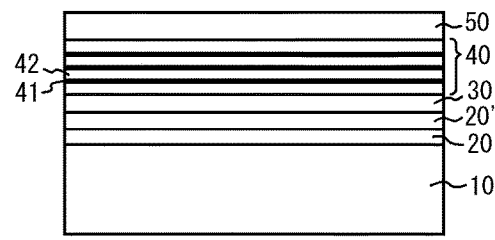
Figure 4:
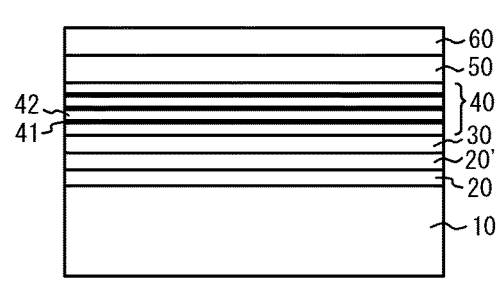
Figure 4:
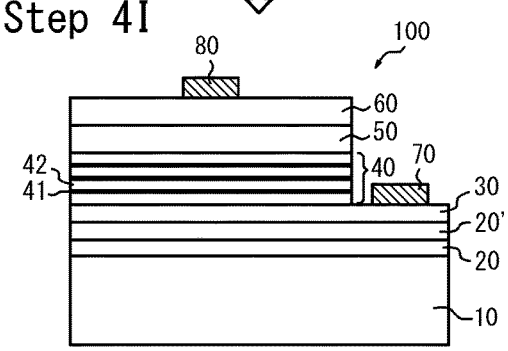

A method of producing the III-nitride semiconductor light-emitting device 100, according to Embodiment 3 includes: an n-type semiconductor layer formation step of forming an n-type semiconductor layer 30 (Step 4E in FIG. 4); a light emitting layer formation step of forming, on the n-type semiconductor layer 30, a light emitting layer 40 which contains at least Al and has a quantum well structure constituted by a stack of well layers 41 and barrier layers 42 (Step 4F in FIG. 4); an electron blocking layer formation step of forming, on the light emitting layer 40, an electron blocking layer 50 having an Al content higher than that of the barrier layers 42 (Step 4G in FIG. 4); and a p-type semiconductor layer formation step of forming a p-type semiconductor layer 60 on the electron blocking layer 50 (Step 4H in FIG. 4). In this embodiment, in the electron blocking layer formation step, a Si-based doped region layer 50*a* is formed by doping with Si-containing impurities. The steps will be described in order below with reference to FIG. 4 illustrating the process steps according to a preferred embodiment of Embodiment 2. Description of features in Embodiment 3 that are similar to those in Embodiments 1 and 2 will not be repeated.

First, a sapphire substrate is prepared as the substrate 10. An AlN template substrate in which an AlN layer is formed on a surface 10A of the substrate 10 is preferably formed, and a commercially available AlN template substrate may be used (see Step 4A and Step 4B in FIG. 4). The AlN layer 20 can be formed by a known thin film deposition technique, for example, by metalorganic chemical vapor deposition (MOCVD), molecular beam epitaxy (MBE), or sputtering.

For the Al source for the AlN layer 20, trimethylaluminum (TMA) can be used. Meanwhile, for the N source, ammonia (NH$_3$) gas can be used. Those source gases are used with hydrogen gas as a carrier gas to form the AlN layer 20.

Note that the growth temperature of the AlN layer 20 is preferably 1270° C. or more and 1350° C. or less, more preferably 1290° C. or more and 1330° C. or less. With this temperature range, the crystallinity of the AlN layer 20 can be improved when heat treatment is performed after that. Further, the growth pressure in the chamber can be, for example, 5 Torr to 20 Torr. More preferably, the growth pressure is 8 Torr to 15 Torr.

The molar ratio of a group V element gas such as NH$_3$ gas to a group III element gas such as TMA gas, calculated based on the growth gas flow rate of the group V element gas and the group III element gas (hereinafter referred to as V/III ratio) can be, for example, 130 or more and 190 or less. More preferably, the V/III ratio is 140 or more and 180 or less. Note that since the growth temperature and the growth pressure determine the optimum V/III ratio, the growth gas flow rate is preferably determined appropriately.

Subsequently, the AlN layer 20 on the sapphire substrate 10, obtained as described above is preferably subjected to a heat treatment at a temperature higher than the growth temperature of the AlN layer 20. The heat treatment process can be performed using a known heat treatment furnace. Performing the heat treatment makes the half width of the X-ray rocking curve of the (10-12) plane of the AlN layer 20 be 400 s or less; thus, high crystallinity can be achieved (Step 4C in FIG. 4).

After that, it is also preferable to form an undoped AlGaN layer 20' on the AlN layer 20 as illustrated in Step 4D of FIG. 4. A layer made of an AlGaN material can be formed using TMA as an Al source, trimethylgallium (TMG) as a Ga source, and NH$_3$ gas as an N source. This also applies to the formation of an n-type semiconductor layer, a light emitting layer, an electron blocking layer, and a p-type semiconductor layer to be described. These source gases may be supplied into a chamber using hydrogen gas or nitrogen gas or a mixed gas of hydrogen and nitrogen as a carrier gas. Hydrogen gas is typically used as the carrier gas. The molar ratio of a group V element gas such as NH$_3$ gas to a group III element gas such as TMA gas, calculated based on the growth gas flow rate of the group V element gas and the group III element gas (hereinafter referred to as V/III ratio) can be, for example, 100 or more and 100000 or less. More preferably, the V/III ratio is 300 or more and 30000 or less. Since the growth temperature and the growth pressure determine the optimum V/III ratio, the growth gas flow rate is preferably determined appropriately as in the case of forming the AlN layer 20.

Next, an n-type semiconductor layer formation step of forming the n-type semiconductor layer 30 is performed (Step 4E in FIG. 4). The n-type semiconductor layer 30 can be formed on the AlN layer 20, preferably on the undoped AlGaN layer 20'. The n-type dopant is as described above.

Subsequently, as illustrated in Step 4F of FIG. 4, the light emitting layer formation step of forming the light emitting layer 40 is performed. When the light emitting layer 40 has a MQW structure, the ratio between the flow rate of the Al source and the flow rate of the Ga source is suitably changed, thereby forming the light emitting layer 40 having a MQW structure. When the light emitting layer 40 is formed from an $Al_aGa_{1-a}N$ material (0<a≤1), the growth temperature of the $Al_aGa_{1-a}N$ material is preferably 1000° C. or more and 1400° C. or less, more preferably 1050° C. or more and 1350° C. or less.

Next, as illustrated in Step 4G of FIG. 4, the electron blocking layer formation step for forming the electron blocking layer 50 on the light emitting layer 40 is performed. As described above, the electron blocking layer 50 includes the Si-based doped region layer 50a doped with Si-containing impurities. As described above, the electron blocking layer 50 preferably has a two-layer structure further including the p-type doped region layer 50c, and more preferably has a three-layer structure further having the undoped region layer 50b between the Si-based doped region layer 50a and the p-type doped region layer 50c.

Si alone or Si and Mg can be used for the dopant(s) used to form the Si-based doped region layer 50a. For the Si source, monosilane ($SiH_4$) or the like can be used, and for the Mg source, bis(cyclopentadienyl)magnesium ($CP_2Mg$) can be used. When doping is performed using a mixture of Si and Mg, a mixed gas of both gases may be supplied into the chamber.

A dopant used to form the p-type doped region layer 50c may be Mg or Zn. For the Mg source, $CP_2Mg$ can be used, and for the Zn source, $ZnCl_2$ can be used.

When the electron blocking layer 50 is formed of an $Al_zGa_{1-z}N$ material ($b<z\leq1$), the electron blocking layer 50 can be formed using a gas mainly containing hydrogen as a carrier gas. The source gases are TMA, TMG, and $NH_3$ gas as described above. Additionally, impurity gases suitable for the Si-based doped region layer 50a, the undoped region layer 50b, and the p-type doped region layer 50c are used.

The growth temperature of the electron blocking layer 50 is preferably 1000° C. or more and 1400° C. or less, more preferably 1050° C. or more and 1350° C. or less. The growth pressure in the chamber can be, for example, 10 Torr to 760 Torr. More preferably, the growth pressure is 20 Torr to 380 Torr.

Next, as depicted in Step 4H of FIG. 4, the p-type semiconductor layer 60 is formed on the electron blocking layer 50. The p-type semiconductor layer 60 has the p-type contact layer 62, and the p-type contact layer 62 is formed of a p-type $Al_xGa_{1-x}N$ material ($0\leq x\leq0.1$). Mg or Zn can be used as a dopant for imparting p-type conductivity to the p-type contact layer 62, as in the case of the p-type doped region layer 50c. The Mg source and the Zn source are also as in the case of the p-type doped region layer 50c.

The growth temperature of the p-type semiconductor layer 60 having the p-type contact layer 62 is preferably 800° C. or more and 1400° C. or less, more preferably 900° C. or more and 1300° C. or less. Further, the growth pressure in the chamber can be, for example, 10 Torr to 760 Torr. More preferably, the growth pressure is 20 Torr to 600 Torr. For the carrier gas, hydrogen gas or nitrogen gas or a mixed gas of both hydrogen and nitrogen can be used as described above. Although not shown, when the p-type contact layer 62 has a plurality of layers, hydrogen gas can be supplied as a carrier gas to the electron blocking layer side, and nitrogen gas can be supplied to the opposite side, and vice versa. A p-type cladding layer may be provided as described above.

Finally, as illustrated in Step 4I of FIG. 4, the light emitting layer 40, the electron blocking layer 50, and the p-type semiconductor layer 60 are partly removed by for example etching. The n-type electrode 70 can be formed on the exposed part of the n-type semiconductor layer 30, and the p-type electrode 80 can be formed on the p-type contact layer 62. Thus, the III-nitride semiconductor light-emitting device 100 in accordance with a preferred embodiment can be fabricated.

Further, although not shown, in order to fabricate the III-nitride semiconductor light-emitting device 200 in accordance with Embodiment 2, in the electron blocking layer formation step of forming the electron blocking layer 50 on the light emitting layer 40 described with reference to Step 4G in FIG. 4, the p-type doped region layer 50d may be formed on the light emitting layer 40, followed by the formation of the Si-based doped region layer 50a. The other steps can be performed in the same manner as in the fabrication of the III-nitride semiconductor light-emitting device 100 according to Embodiment 1, thus fabricating the III-nitride semiconductor light-emitting device 200.

EXAMPLES

Experimental Example 1

Example 1

The disclosed method of producing a III-nitride semiconductor light-emitting device will be described in more detail below using examples. However, this disclosure is not limited to the following examples. A III-nitride semiconductor light-emitting device was fabricated in accordance with the process steps illustrated in Steps 4A to 4I of FIG. 4. First, a sapphire substrate (diameter: 2 in, thickness: 430 mm, lattice plane: (0001), off-angle θ in m-axis direction: 0.5°, terrace width: 100 nm, step height: 0.20 nm) was prepared (Step 4A). Next, an AlN layer having a center thickness of 0.60 mm (average thickness: 0.61 mm) was grown on the above sapphire substrate by MOCVD to obtain an AlN template substrate (Step 4B). On that occasion, the growth temperature of the AlN layer was 1300° C., the growth pressure in the chamber was 10 Torr, and the growth gas flow rate of ammonia gas and TMA gas was set so that the V/III ratio was 163. The flow rate of the group V element gas ($NH_3$) was 200 sccm, and the flow rate of the group III element gas (TMA) was 53 sccm. For the thickness of the AlN layer, the thicknesses of total 25 portions distributed at regular intervals, including the center of the wafer plane were measured using an interference thickness measurement system (Nanospec M6100A manufactured by Nanometrics Incorporated).

Next, the above AlN template substrate was introduced into a heat treatment furnace. After the pressure of the furnace was reduced to 10 Pa, the furnace was purged with nitrogen gas to achieve a nitrogen gas atmosphere in the furnace, and the temperature inside the furnace was then raised, thus performing heat treatment on the AlN template substrate (Step 4C). The heat treatment was performed at a heating temperature of 1650° C. for a heating time of four hours.

Subsequently, an undoped $Al_{0.7}Ga_{0.3}N$ layer made of $Al_{0.7}Ga_{0.3}N$ with a thickness of 1 mm was formed as an undoped AlGaN layer by MOCVD (Step 4D). Next, as an n-type semiconductor layer, an n-type $Al_{0.62}Ga_{0.38}N$ layer with a thickness of 2 mm made of $Al_{0.62}Ga_{0.38}N$ doped with Si was formed on the above AlGaN layer (Step 4E). Note that according to a result of SIMS analysis, the Si concentration of the n-type semiconductor layer was $1.0\times10^{19}$ atoms/$cm^3$.

Next, on the n-type semiconductor layer, well layers made of $Al_{0.45}Ga_{0.55}N$ with a thickness of 3 nm and barrier layers made of $Al_{0.65}Ga_{0.35}N$ with a thickness of 7 nm were alternately and repeatedly stacked, thereby forming a light emitting layer having 3.5 pairs of the layers (Step 4F). Of the 3.5 pairs, 0.5 pair indicates that the top and bottom layers in the light emitting layer were barrier layers.

On the light emitting layer, an electron blocking layer made of $Al_{0.68}Ga_{0.32}N$ with a thickness of 40 nm was then formed using hydrogen gas as a carrier gas (Step 4G). In forming the electron blocking layer, monosilane ($SiH_4$) gas was supplied into the chamber at 10 sccm for a first 5 nm thick part (corresponding to the Si-based doped region layer), and the dopant gas supply was stopped before the formation of a subsequent 15 nm thick part (corresponding to the undoped region layer), and the remaining 20 nm thick part (corresponding to the p-type doped region layer) was doped with Mg. According to a result of SIMS analysis, the Si concentration of the Si-based doped region layer was $6.0 \times 10^{16}$ atoms/cm$^3$, the impurity concentration of the undoped region layer was $4.0 \times 10^{16}$ atoms/cm$^3$ or less, and the Mg concentration of the p-type doped region layer was $5.0 \times 10^{18}$ atoms/cm$^3$.

Further, a p-type cladding layer made of $Al_{0.35}Ga_{0.65}N$, doped with Mg was formed to a thickness of 50 nm. Subsequently, a p-type contact layer made of GaN, doped with Mg was formed to a thickness of 180 nm. The flow rate of the TMG gas was reduced to increase the probability of the presence of Mg in a region of the p-type contact layer with a thickness of 30 nm of the total thickness of 180 nm, the region being in contact with the electrode, and the growth rate was reduced, thereby obtaining a layer having a high Mg concentration (Step 4H). According to a result of SIMS analysis, the Mg concentration of the p-type cladding layer was $1.0 \times 10^{19}$ atoms/cm$^3$, the Mg concentration of a 150 nm thick part of the p-type contact layer on the p-type cladding layer side was $3.0 \times 10^{19}$ atoms/cm$^3$, and the remaining 30 nm thick part made to have the highest Mg concentration had a Mg concentration of $1.2 \times 10^{20}$ atoms/cm$^3$.

After that, a mask was formed on the p-type contact layer, and mesa etching was performed by dry etching to expose the n-type semiconductor layer. Next, a p-type electrode made of Ni/Au was formed on the p-type contact layer, and an n-type electrode made of Ti/Al was formed on the exposed n-type semiconductor layer. Note that the p-type electrode had Ni with a thickness of 50 angstrom and Au with a thickness of 1500 angstrom. Further, the n-type electrode had Ti with a thickness of 200 angstrom and Al with a thickness of 1500 angstrom. Lastly, contact annealing (RTA) was performed at 550° C. to finish the electrodes (Step 4I). Thus, a III-nitride semiconductor light-emitting device of Example 1 was fabricated. The layer structure of Example 1 is presented in Table 1.

TABLE 1

| | Al content | Dopant | Thickness | |
|---|---|---|---|---|
| P-type contact layer | 0 | Mg | 180 | nm |
| P-type cladding layer | 0.35 | Mg | 50 | nm |
| Electron blocking layer | 0.68 | Mg | 20 | nm |
| | — | | 15 | nm |
| | | Si | 1 | nm |
| Light emitting layer | 0.65 | — | 7 | nm |
| | 0.45 | — | 3 | nm |
| | 0.65 | Si | 7 | nm |
| | 0.45 | — | 3 | nm |
| | 0.65 | Si | 7 | nm |
| | 0.45 | — | 3 | nm |
| | 0.65 | Si | 7 | nm |
| N-type semiconductor layer | 0.60 | Si | 2 | μm |
| Undoped AlGaN layer | 0.70 | — | 1 | μm |
| AlN layer | 1 | — | 0.6 | μm |
| Sapphire substrate | — | — | 430 | μm |

Example 2

A III-nitride semiconductor light-emitting device according to Example 2 was fabricated under entirely the same conditions as in Example 1 except that an undoped region layer was not formed in the electron blocking layer, and a first 20 nm thick part of the electron blocking layer was doped with Si.

Conventional Example 1

A III-nitride semiconductor light-emitting device according to Conventional Example 1 was fabricated under entirely the same conditions as in Example 1 except that the whole electron blocking layer was doped with Mg.

The structures of the electron blocking layer according to Examples 1 to 2 and Conventional Example 1 above are presented in Table 2 below. Table 2 also presents the evaluation results to be described.

TABLE 2

| | Thickness of Electron blocking layer (Al 0.68) [nm] | | | Evaluation results | | |
|---|---|---|---|---|---|---|
| | Si doped | Undoped | Mg doped | Residual light output after 1 h [%] | Po [mW] | Vf [V] |
| Example 1 | 5 | 15 | 20 | 99 | 2.4 | 8.2 |
| Example 2 | 20 | 0 | 20 | 100 | 1.0 | 7.7 |
| Conventional Example 1 | 0 | 0 | 40 | 97 | 2.7 | 7.5 |

Example 3

A III-nitride semiconductor light-emitting device according to Example 3 was fabricated under entirely the same conditions as in Example 1 except that the whole electron blocking layer was doped with Si and Mg, the thickness of the whole electron blocking layer was 20 nm, and a p-type cladding layer made of $Al_{0.50}Ga_{0.50}N$ having a thickness of 20 nm doped with Mg was further formed between the electron blocking layer and the p-type cladding layer made of $Al_{0.35}Ga_{0.65}N$. In doping of the electron blocking layer, SiH$_4$ gas was supplied at 10 sccm, and Cp$_2$Mg gas was supplied at 500 sccm, into the chamber. The Si concentration of the electron blocking layer was $6.0 \times 10^{16}$ atoms/cm$^3$, and the Mg concentration thereof was $5.0 \times 10^{18}$ atoms/cm$^3$. Further, the Mg concentration of the p-type cladding layer made of $Al_{0.50}Ga_{0.50}N$ was $5.0 \times 10^{18}$ atoms/cm$^3$. The layer structure of Example 3 is presented in Table 3.

TABLE 3

| | Al content | Dopant | Thickness | |
|---|---|---|---|---|
| P-type contact layer | 0 | Mg | 180 | nm |
| P-type cladding layer | 0.35 | Mg | 50 | nm |
| | 0.50 | Mg | 20 | nm |
| Electron blocking layer | 0.68 | Mg + Si | 20 | nm |
| Light emitting layer | 0.65 | — | 7 | nm |
| | 0.45 | — | 3 | nm |
| | 0.65 | Si | 7 | nm |
| | 0.45 | — | 3 | nm |
| | 0.65 | Si | 7 | nm |
| | 0.45 | — | 3 | nm |
| | 0.65 | Si | 7 | nm |
| N-type semiconductor layer | 0.60 | Si | 2 | μm |
| Undoped AlGaN layer | 0.70 | — | 1 | μm |
| AlN layer | 1 | — | 0.6 | μm |
| Sapphire substrate | — | — | 430 | μm |

Conventional Example 2

A nitride semiconductor light-emitting device according to Conventional Example 2 was fabricated under entirely the same conditions as in Example 3 except that the whole electron blocking layer was doped with Mg.

Comparative Example 1

A III-nitride semiconductor light-emitting device according to Comparative Example 1 was fabricated under entirely the same conditions as in Example 3 except that the whole electron blocking layer was undoped.

The structures of the electron blocking layer according to Example 3, Comparative Example 1, and Conventional Example 2 above are presented in Table 4. Table 4 also presents the evaluation results to be described.

TABLE 4

| | Thickness of Electron blocking layer (Al 0.68) [nm] | | | Evaluation results | | |
|---|---|---|---|---|---|---|
| | Si + Mg doped | Undoped | Mg doped | Residual light output after 1 h [%] | Po [mW] | Vf [V] |
| Example 3 | 20 | 0 | 0 | 91 | 2.5 | 6.6 |
| Conventional Example 2 | 0 | 0 | 20 | 87 | 2.8 | 8.7 |
| Comparative Example 1 | 0 | 20 | 0 | 84 | 2.8 | 7.1 |

<Evaluation of Light Emission Lifetime>

The light output power Po (mW) of the flip-chip III-nitride semiconductor light-emitting device fabricated in accordance with Example 1 was measured at a current of 20 mA using an integrating sphere, and the residual output of the device having been energized for one hour (output after 1 h energization/initial light output) was measured and was 99% with respect to the initial output. The results are presented in Table 3. The residual outputs of the devices according to Examples 2, 3, Comparative Example 1, and Conventional Examples 1, 2 having been energized for one hour were also measured and were as presented in Tables 3 and 4.

Comparing Conventional Example 1 with Examples 1 and 2, the lifetime of the III-nitride semiconductor light-emitting devices of Examples 1 and 2, in which the Si-doped layer was formed was found to have improved. Similarly, comparing Conventional Example 2 and Example 3, in which the p-type cladding layer made of $Al_{0.50}Ga_{0.50}N$ was provided, the lifetime was found to have improved in Example 3, in which the Si-based doped region layer was provided. Note that, comparing Conventional Example 2 and Comparative Example 1, it was found that the lifetime had rather decreased when the electron blocking layer was undoped instead of being doped with Mg.

<Evaluation of Light Emission Characteristics and Forward Voltage>

The light output power Po (mW) and the forward voltage $V_f$ (V) of the flip-chip III-nitride semiconductor light-emitting device fabricated in accordance with Example 1 were measured at a current of 20 mA using an integrating sphere and were 2.4 mW and 8.2 V, respectively. Similarly, the light output power Po and the forward voltage $V_f$ were measured with respect to Examples 2,3, Comparative Example 1, and Conventional Examples 1,2 and were as presented in Tables 3 and 4.

Comparing Conventional Example 1 with Examples 1 and 2, it was found that when an undoped region layer was provided in the electron blocking layer, reduction in the light output power was successfully suppressed although improvement in the device lifetime was slightly reduced. Conversely, when the thickness of the Si-doped layer was large, the effect in improving the device lifetime was found to be maximized. Further, comparing Conventional Example 2 and Example 3, doping with Si and Mg was found to reduce the forward voltage while improving the lifetime.

Experimental Example 2

Examples 1 to 3 in Experimental Example 1 above demonstrated that the effect in improving the reliability such as device lifetime was ensured. However, as compared with Conventional Examples 1 and 2, in which the Si-doped layer was not provided, the light output power would decrease albeit slightly. In order to address this problem, an experiment was performed as described below to improve the reliability without reducing the light output power.

Example 4

For the formation of the electron blocking layer, the thickness of the whole electron blocking layer was set to 20 nm, a 15 nm thick part on the light emitting layer side was a Mg-doped layer, and the remaining 5 nm thick part, i.e., Si—Mg doped region layer, on the p-type semiconductor layer side was doped with Si and Mg. In the formation of the p-type semiconductor layer, a p-type cladding layer was not formed, and only a p-type contact layer was formed. A III-nitride semiconductor light-emitting device according to Example 4 was fabricated under entirely the same conditions as in Example 1 except for the above conditions. In doping the electron blocking layer with Mg and Si, $Cp_2Mg$ gas was supplied into the chamber at 250 sccm to form the 15 nm thick part, and $SiH_4$ gas was then added at 12 sccm, thereby doping the remaining 5 nm thick part on the p-type semiconductor layer side with both Mg and Si. According to a result of SIMS analysis, the Mg concentration of the electron blocking layer was $2\times10^{18}$ atoms/cm$^3$ across the whole layer, and the Si concentration of the Si—Mg doped region layer was $2.0\times10^{18}$ atoms/cm$^3$. The layer structure of Example 4 is presented in Table 5.

TABLE 5

| | Al content | Dopant | Thickness |
|---|---|---|---|
| P-type contact layer | 0 | Mg | 180 nm |
| Electron blocking layer | 0.68 | Mg + Si | 5 nm |
| | | Mg | 15 nm |
| Light emitting layer | 0.65 | — | 7 nm |
| | 0.45 | — | 3 nm |
| | 0.65 | Si | 7 nm |
| | 0.45 | — | 3 nm |
| | 0.65 | Si | 7 nm |
| | 0.45 | — | 3 nm |
| | 0.65 | Si | 7 nm |
| N-type semiconductor layer | 0.60 | Si | 2 μm |
| Undoped AlGaN layer | 0.70 | — | 1 μm |
| AlN layer | 1 | — | 0.6 μm |
| Sapphire substrate | — | — | 430 μm |

Example 5

A III-nitride semiconductor light-emitting device according to Example 5 was fabricated in the same manner as in Example 4 except that a 18 nm thick part of the electron blocking layer on the light emitting layer side was doped with Mg, and the remaining 2 nm thick part was doped with Mg and Si.

Example 6

A III-nitride semiconductor light-emitting device according to Example 6 was fabricated in the same manner as in Example 4 except that a 60 nm thick part of the electron blocking layer on the light emitting layer side was doped with Mg, and the remaining 20 nm part was doped with Mg and Si (i.e., the thickness of each part in the electron blocking layer was four times that in Example 4).

Example 7

A III-nitride semiconductor light-emitting device according to Example 7 was fabricated in the same manner as in Example 6 except that a 75 nm thick part of the electron blocking layer on the light emitting layer side was doped with Mg, the remaining 5 nm thick part was doped with Mg and Si, and the Si concentration of the region doped with Si and Mg was increased from $2.0 \times 10^{18}$ atoms/cm$^3$ to $1.0 \times 10^{19}$ atoms/cm$^3$.

Comparative Example 2

A III-nitride semiconductor light-emitting device according to Comparative Example 2 was fabricated under entirely the same conditions as in Example 4 except that the whole electron blocking layer was doped with Mg.

The structures of the electron blocking layer in Examples 4 to 7 and Comparative Example 2 above are presented in Table 6 below. Further, the devices of Examples 4 to 7 and Comparative Example 2 were evaluated in the same manner as in Experimental Example 1. Table 6 also presents the evaluation results.

improved the reliability of the device without reducing the light output power while rather increasing the light output power even as compared with the case where the Si-based doped region layer was not provided.

INDUSTRIAL APPLICABILITY

This disclosure is useful because a III-nitride semiconductor light-emitting device having excellent device lifetime as compared with conventional devices, and a method of producing the III-nitride semiconductor light-emitting device can be provided.

REFERENCE SIGNS LIST

10: Substrate
10A: Main surface of substrate
20: AlN layer
30: N-type semiconductor layer
40: Light emitting layer
41: Well layer
42: Barrier layer
50: Electron blocking layer
50a: Si-based doped region layer
50b: Undoped region layer
50c: P-type doped region layer
50d: P-type doped region layer
60: P-type semiconductor layer
61: P-type cladding layer
62: P-type contact layer
70: N-type electrode
80: P-type electrode
100: III-nitride semiconductor light-emitting device

The invention claimed is:
1. A III-nitride semiconductor light-emitting device including an n-type semiconductor layer; a light emitting layer containing at least Al; an electron blocking layer; and a p-type semiconductor layer in this order,
wherein the light emitting layer has a quantum well structure constituted by a stack of well layers and barrier layers,
the electron blocking layer is adjacent to the light emitting layer and is formed from a layer having an Al content higher than that of the barrier layers and the p-type semiconductor layer, and
the electron blocking layer includes a Si-based doped region layer, and wherein a dopant for the Si-based doped region layer is Si alone.
2. The III-nitride semiconductor light-emitting device according to claim 1, wherein the electron blocking layer

TABLE 6

| | Electron blocking layer | | | | Evaluation results | | |
| --- | --- | --- | --- | --- | --- | --- | --- |
| | Light emitting layer side | | P-type contact layer side | | Residual light | | |
| | Dopant | Thickness [nm] | Dopant | Thickness [nm] | output after 1 h [%] | Po [mW] | Vf [V] |
| Example 4 | Mg | 15 | Mg + Si | 5 | 100 | 2.9 | 5.9 |
| Example 5 | Mg | 18 | Mg + Si | 2 | 95 | 2.6 | 5.8 |
| Example 6 | Mg | 60 | Mg + Si | 20 | 100 | 3.2 | 8.6 |
| Example 7 | Mg | 75 | Mg + Si | 5* | 100 | 3.4 | 7.3 |
| Comparative Example 2 | Mg | 20 | — | — | 87 | 2.5 | 5.8 |

*The Si concentration in Example 7 was $1.0 \times 10^{19}$ atoms/cm$^3$

The results of Experimental Example 2 above demonstrated that the provision of the p-type doped region layer doped with Mg in the electron blocking layer on the light emitting layer side and the placement of the Si-based doped region layer on the p-type semiconductor layer side further includes a p-type doped region layer closer to the p-type semiconductor layer than to the Si-based doped region layer.

3. The III-nitride semiconductor light-emitting device according to claim 1, wherein the Si-based doped region layer is adjacent to the light emitting layer.

4. The III-nitride semiconductor light-emitting device according to claim 1, wherein an impurity concentration of Si in the Si-based doped region layer is $5 \times 10^{16}$ atoms/cm$^3$ to $1 \times 10^{18}$ atoms/cm$^3$.

5. The III-nitride semiconductor light-emitting device, according to claim 1, wherein the barrier layer is made of $Al_bGa_{1-b}N$, where b satisfies $0.4 \leq b \leq 0.95$, and the electron blocking layer is made of $Al_zGa_{1-z}N$, where z satisfies $b<z\leq1$.

6. The III-nitride semiconductor light-emitting device according to claim 1, wherein light emitted from the light emitting layer is deep ultraviolet light having a center wavelength of 300 nm or less.

7. The III-nitride semiconductor light-emitting device according to claim 1, wherein the electron blocking layer further includes an undoped region layer.

8. The III-nitride semiconductor light-emitting device according to claim 7, wherein the undoped region layer is disposed between the Si-based doped region layer and the p-type doped region layer.

9. The III-nitride semiconductor light-emitting device according to claim 1, wherein the p-type semiconductor layer includes a p-type contact layer made of $Al_xGa_{1-x}N$, where x satisfies $0 \leq x \leq 0.1$.

10. The III-nitride semiconductor light-emitting device according to claim 9, further comprising a p-type cladding layer having an Al content lower than that of the electron blocking layer and an Al content higher than that of the p-type contact layer, between the electron blocking layer and the p-type contact layer.

11. The III-nitride semiconductor light-emitting device according to claim 10, wherein the p-type cladding layer is made of $Al_yGa_{1-y}N$, where y satisfies $0.2 \leq y$.

12. A method of producing a III-nitride semiconductor light-emitting device, comprising:
    an n-type semiconductor layer formation step of forming an n-type semiconductor layer;
    a light emitting layer formation step of forming, on the n-type semiconductor layer, a light emitting layer which contains at least Al and has a quantum well structure constituted by a stack of well layers and barrier layers;
    an electron blocking layer formation step of forming, on the light emitting layer, an electron blocking layer having an Al content higher than that of the barrier layers; and
    a p-type semiconductor layer formation step of forming a p-type semiconductor layer on the electron blocking layer,
    wherein in the electron blocking layer formation step, a Si-based doped region layer is formed by doping with Si alone.

13. A III-nitride semiconductor light-emitting device including an n-type semiconductor layer; a light emitting layer containing at least Al; an electron blocking layer; and a p-type semiconductor layer in this order,
    wherein the light emitting layer has a quantum well structure constituted by a stack of well layers and barrier layers,
    the electron blocking layer is adjacent to the light emitting layer and is formed from a layer having an Al content higher than that of the barrier layers and the p-type semiconductor layer,
    the electron blocking layer includes a Si-based doped region layer, and
    the electron blocking layer further includes a p-type doped region layer closer to the light emitting layer than to the Si-based doped region layer, and
    the p-type semiconductor layer is formed on the Si-based doped region layer.

14. The III-nitride semiconductor light-emitting device according to claim 13, wherein the Si-based doped region layer is adjacent to the p-type semiconductor layer.

15. The III-nitride semiconductor light-emitting device, according to claim 13, wherein the barrier layer is made of $Al_bGa_{1-b}N$, where b satisfies $0.4 \leq b \leq 0.95$, and the electron blocking layer is made of $Al_zGa_{1-z}N$, where z satisfies $b<z\leq1$.

16. The III-nitride semiconductor light-emitting device according to claim 13, wherein a dopant for the p-type doped region layer is Mg.

17. The III-nitride semiconductor light-emitting device according to claim 13, wherein dopants for the Si-based doped region layer are Si and Mg.

18. The III-nitride semiconductor light-emitting device according to claim 13, wherein light emitted from the light emitting layer is deep ultraviolet light having a center wavelength of 300 nm or less.

19. The III-nitride semiconductor light-emitting device according to claim 13, wherein the p-type doped region layer is adjacent to the light emitting layer.

\* \* \* \* \*